(12) United States Patent
Kobayashi

(10) Patent No.: US 7,429,768 B2
(45) Date of Patent: Sep. 30, 2008

(54) SEMICONDUCTOR DEVICE HAVING A TRENCH SURROUNDING EACH OF PLURAL UNIT CELLS

(75) Inventor: Kenya Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 239 days.

(21) Appl. No.: 11/018,499

(22) Filed: Dec. 22, 2004

(65) Prior Publication Data

US 2005/0139873 A1 Jun. 30, 2005

(30) Foreign Application Priority Data

Dec. 26, 2003 (JP) .............................. 2003-432376

(51) Int. Cl.
*H01L 21/8222* (2006.01)

(52) U.S. Cl. ............................. 257/328; 257/E29.257

(58) Field of Classification Search ......... 257/327–331, 257/339, 340–342, 510, E29.257, E29.258, 257/E21.418; 438/270, 491
See application file for complete search history.

(56) References Cited

U.S. PATENT DOCUMENTS

| 5,770,878 | A  | * | 6/1998  | Beasom ..................... 257/330 |
| 6,049,108 | A  | * | 4/2000  | Williams et al. ............ 257/341 |
| 6,204,533 | B1 |   | 3/2001  | Williams et al. |
| 6,312,993 | B1 | * | 11/2001 | Hshieh et al. ............... 438/270 |
| 6,351,009 | B1 | * | 2/2002  | Kocon et al. ................ 257/328 |
| 6,445,036 | B1 | * | 9/2002  | Maruoka ..................... 257/330 |
| 6,818,945 | B2 | * | 11/2004 | Kawaguchi et al. ......... 257/328 |
| 7,078,296 | B2 | * | 7/2006  | Chau et al. .................. 438/270 |
| 2002/0105027 | A1 | * | 8/2002  | Fujihira ...................... 257/328 |
| 2002/0179950 | A1 | * | 12/2002 | Hijzen et al. ................ 257/301 |
| 2006/0186466 | A1 | * | 8/2006  | Mizokuchi et al. .......... 257/330 |
| 2006/0214222 | A1 | * | 9/2006  | Challa et al. ................ 257/328 |
| 2007/0040213 | A1 | * | 2/2007  | Hotta et al. ................. 257/330 |

FOREIGN PATENT DOCUMENTS

| CN | 1353863    | 6/2002  |
| JP | 2000-31484 | 1/2000  |
| JP | 2004-311529| 11/2004 |
| JP | 2005-11965 | 1/2005  |
| KR | 10-0199273 | 3/1999  |
| KR | 10-0250350 | 1/2000  |

\* cited by examiner

*Primary Examiner*—Howard Weiss
*Assistant Examiner*—Hoa B Trinh
(74) *Attorney, Agent, or Firm*—Young & Thompson

(57) ABSTRACT

A semiconductor device comprises a plurality of unit cells, each comprising a vertical metal oxide semiconductor field effect transistor (MOSFET). The unit cell includes a first source region formed in a first base region, a second source region formed in the first base region and separated from the first source region, and a second base region formed in the first base region and disposed between the first and second source regions. The semiconductor device further comprises a trench gate formed in a vicinity of each of the plurality of unit cells. The second base region of an unit cell is separated from the second base region of an adjacent unit cell, and the first or second source region of an unit cell is separated from the first or second source region of an adjacent unit cell.

14 Claims, 18 Drawing Sheets

SEMICONDUCTOR DEVICE HAVING A TRENCH SURROUNDING EACH OF PLURAL UNIT CELLS

BACKGROUND OF THE INVENTION

1. Field of the Invention

The present invention relates to semiconductor device having a plurality of vertical metal oxide semiconductor field effect transistor (MOSFET) unit cells.

2. Description of the Related Art

A vertical MOSFET is used in power electronics field. A commonly used vertical MOSFET is a trench gate MOSFET.

The vertical MOSFET includes first and second source electrode regions and a base region. When viewed from above, the three regions are arranged in the order of the first source region, the base region, and the second source region. The first and second source regions are a first conductivity type (for example, $N^+$ source regions), and the base region is a second conductivity type opposite to the first conductivity type (for example, a $P^+$ base region).

An example of the semiconductor device having a plurality of vertical MOSFET unit cells is described in Japanese Unexamined Patent Publication No. 2000-031484. The semiconductor device aims at increasing cell density and decreasing on-resistance. FIG. 20 shows the semiconductor device. An $N^+$ source region 102 is formed on a $P^+$ base region 101. The $N^+$ source region 102 has openings where the $P^+$ base region 101 is exposed. FIG. 21 is a top view of this device. Three regions of a first $N^+$ source region 103, a $P^+$ base region 104, and a second $N^+$ source region 105 are sequentially arranged in the surface part of the device.

The semiconductor device shown in FIGS. 20 and 21 has a plurality of unit cells arranged in a row. Thus, the $P^+$ base regions 101 of two adjacent unit cells are continuous. Further, the $N^+$ source region 102 is common to two adjacent unit cells. In other words, the $N^+$ source regions 102 of adjacent unit cells are continuous.

In this semiconductor device, a channel region 106 is formed only in both sides of the $N^+$ source region 102. This device thus fails to obtain a high channel density, which impedes the achievement of higher power MOSFET.

In addition, the semiconductor device shown in FIGS. 20 and 21 has a connecting portion 107 that connects the first and second $N^+$ source regions 103 and 105 in both sides of the $P^+$ base region 104. The minimum width required for the formation of the connecting portion 107 and the $P^+$ base region 104 restricts the increase in integration density. The entire channel width is thereby restricted, making it difficult to reduce the on-resistance.

Normally in the vertical MOSFET, an avalanche current flows through the base region when a high reverse bias voltage that exceeds the withstand voltage is applied. Thus, if a reverse bias voltage increases, the avalanche current flows due to avalanche breakdown.

Hence, if base regions of a plurality of vertical MOSFETs are close to each other, a large current flow is concentrated to cause gate oxide layer breakdown and the like.

SUMMARY OF THE INVENTION

According to a first aspect of this invention, a semiconductor device comprises a plurality of unit cells, each comprising a vertical metal oxide semiconductor field effect transistor (MOSFET). The unit cell includes a first source region formed in a first base region, a second source region formed in the first base region and separated from the first source region, and a second base region formed in the first base region and disposed between the first and second source regions. The semiconductor device further comprises a trench gate formed in a vicinity of each of the plurality of unit cells. The second base region of an unit cell is separated from the second base region of an adjacent unit cell, and the first or second source region of an unit cell is separated from the first or second source region of an adjacent unit cell.

According to another aspect of this invention, a semiconductor device comprises a plurality of unit cells, each comprising a vertical metal oxide semiconductor field effect transistor (MOSFET). The unit cell includes a first source region formed in a first base region, a second source region formed in the first base region and separated from the first source region, and a second base region formed in the first base region and disposed between the first and second source regions. The semiconductor device further comprises a trench gate formed in a vicinity of each of the plurality of unit cells. A channel region in the first base region under the first and second source regions is formed along a side surface of each unit cell except for a part adjacent to the second base region

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferred embodiments of the invention are explained hereinafter with reference to the drawings.

Figure 1:
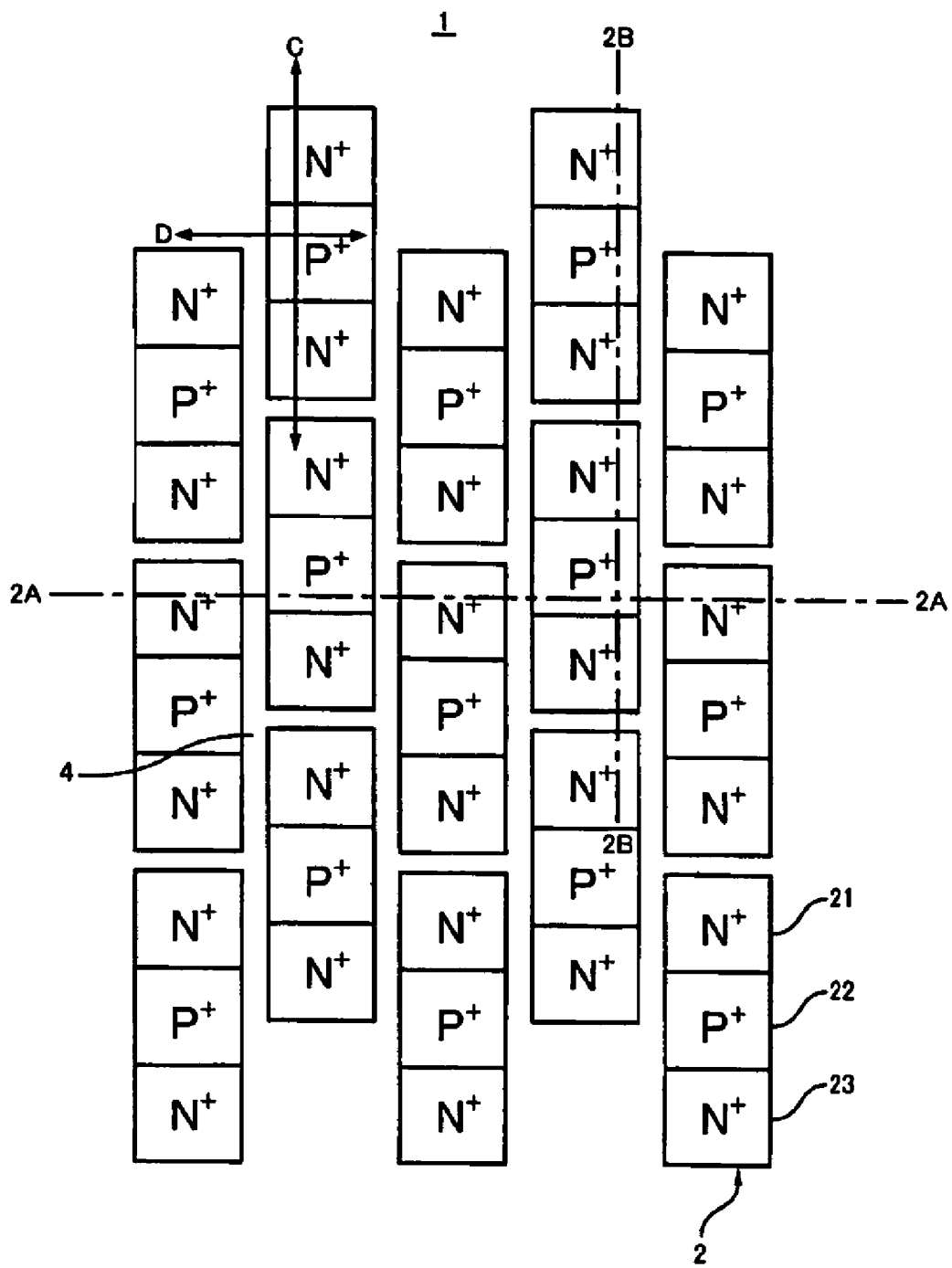
FIG. 1 is a view showing the planar layout of unit cells of a semiconductor device of an embodiment of the invention.
Figure 2A:
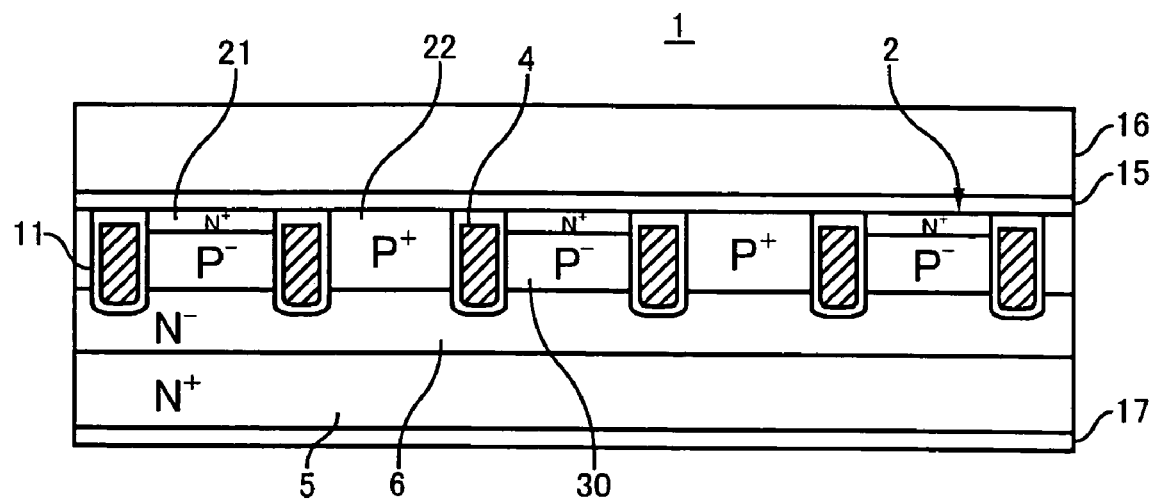
FIGS. 2A and 2B are cross sectional views of the semiconductor device of FIG. 1 along line A-A and line B-B, respectively.
Figure 2B:
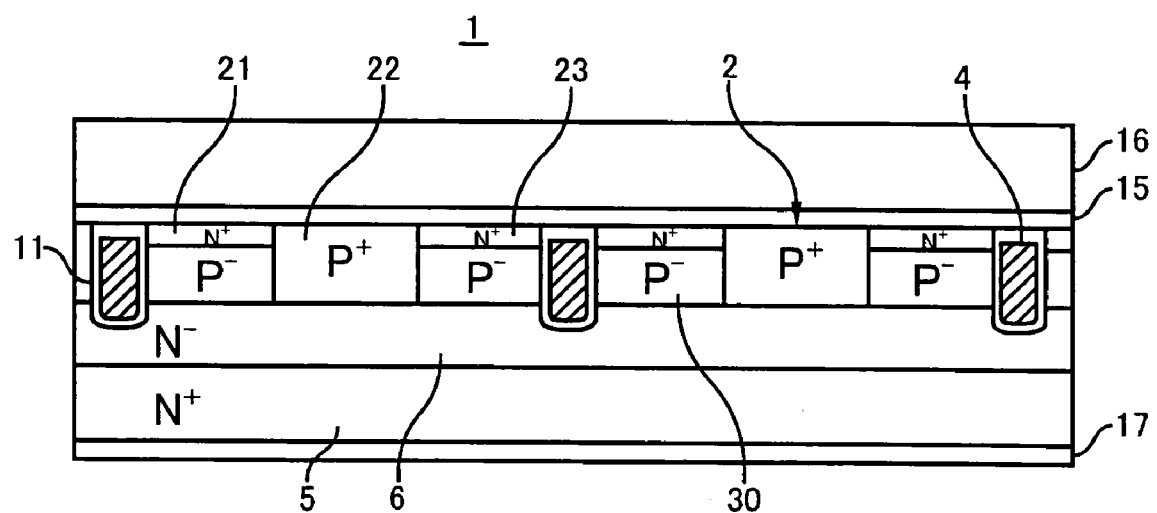

FIG. 1 shows the planar layout of unit cells in a semiconductor device of an embodiment. FIGS. 2A and 2B show the cross sections along line 2A-2A and line 2B-2B of FIG. 1, respectively.

The semiconductor device 1 of this embodiment has a plurality of vertical MOSFETs (unit cells) 2. The vertical MOSFET 2 is surrounded with a trench gate electrode (gate) 4, which is formed in the gap between the MOSFETs 2. The vertical MOSFET 2 is thus a trench gate MOSFET, which is also called UMOS.

The vertical MOSFET 2 has a P⁻ base region (low concentration base region) 30 as shown in FIGS. 2A and 2B. The P base region 30 is formed in the area surrounded with the gate electrode 4.

The vertical MOSFET 2 also has a first N⁺ source region (first source region) 21, a P⁺ base region (high impurity base region) 22, and a second N⁺ source region (second source region) 23. When viewed from above, the three regions are arranged in the order of: the first source region 21, the base region 22, and the second source region 23.

The first N⁺ source region 21 is formed in the surface part of the P⁻ base region 30. The P⁺ base region 22 is formed in at least the surface part of the P⁻ base region 30. In this embodiment, the P⁺ base region 22 exists in the entire depth of the P base region 30 as shown in FIGS. 2A and 2B. The second N⁺ source region 23 is formed in the surface part of the P⁻ base region 30 different from the part where the first N⁺ source region 21 is formed. The P⁻ base region 30 exists under the first and second N⁺ source regions 21 and 23.

The three regions of the first N⁺ source region 21, P⁺ base region 22, and second N⁺ source region 23 are each substantially rectangular-shaped when viewed from above. They are substantially cube-shaped. For simplification, FIG. 1 shows the numerical symbols 21, 22, and 23 for the first N⁺ source region, P⁺ base region, and second N⁺ source region, respectively, of only one MOSFET 2.

In each vertical MOSFET 2, the first N⁺ source region 21 and the second N⁺ source region 23 are separated from each other.

Further, since the gate electrode 4 exists between adjacent vertical MOSFETs 2, the N⁺ source regions (the first N⁺ source region 21 and the second N⁺ source region 23) of the MOSFETs 2 are separated from each other. The P⁺ base regions of the MOSFETs 2 are also separated from each other.

Figure 17:
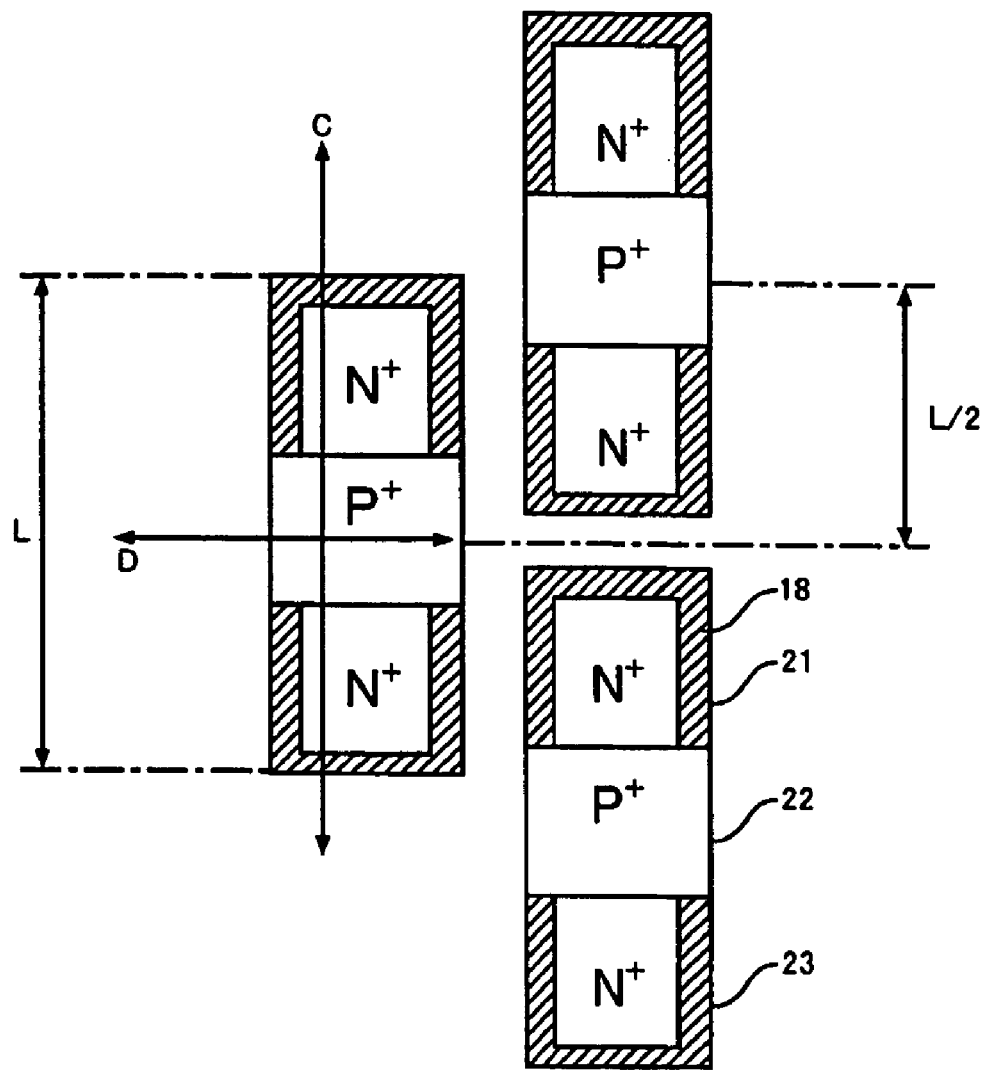
FIG. 17 is a partly enlarged view of the semiconductor device of FIG. 1 and FIG. 3.
Figure 18A:
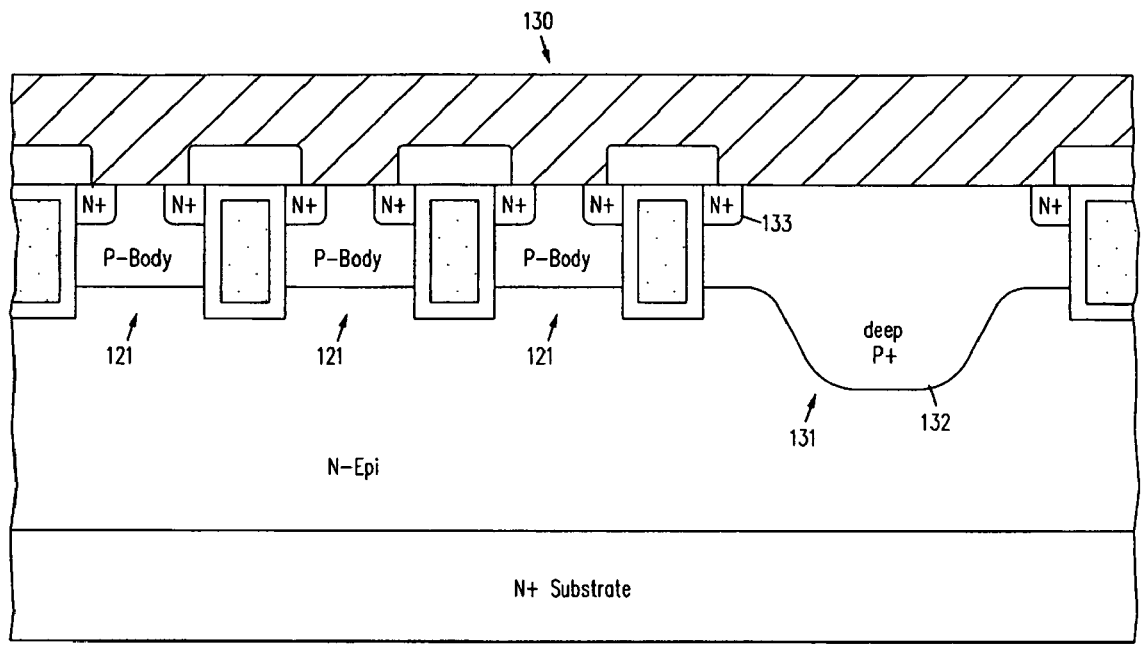
FIG. 18 is a view showing the planar layout of unit cells where a gap between the unit cells is cross-shaped.
Figure 18B:
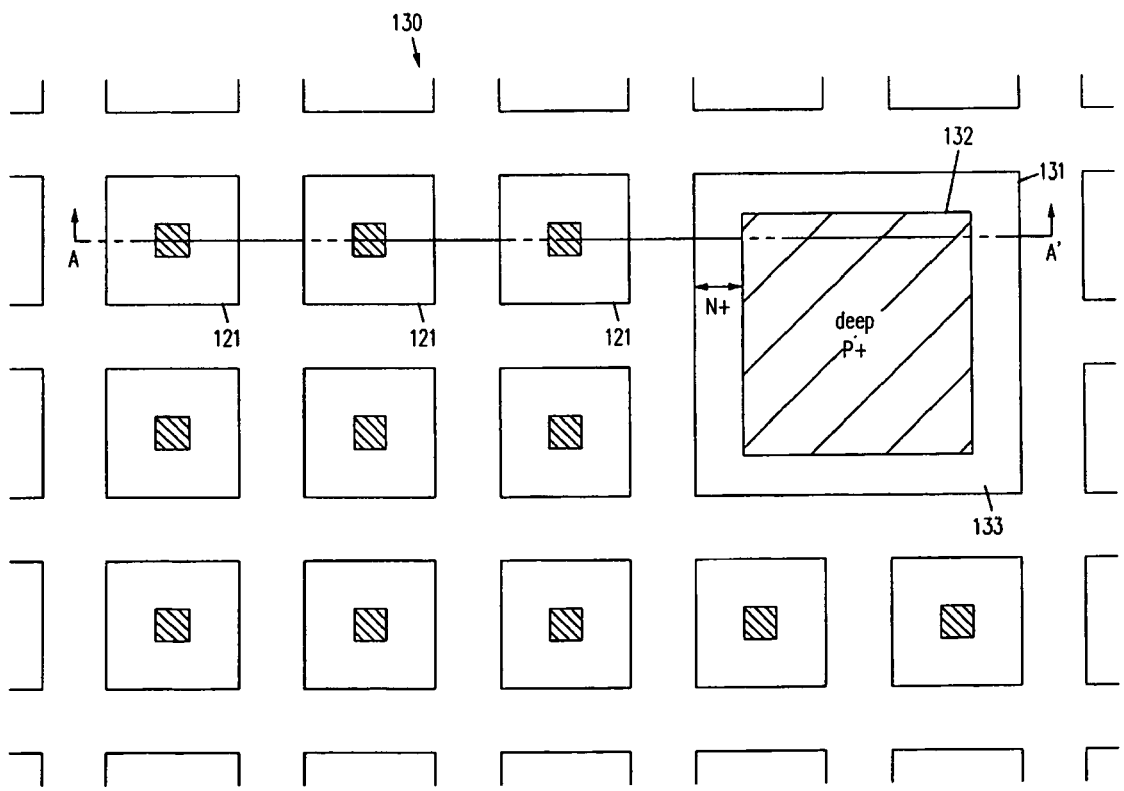

An arrangement direction C along which the three regions 21, 22, 23 are arranged when viewed from above is the same in all the vertical MOSFETs 2 as shown in FIGS. 1 and 17. The vertical MOSFETs 2 may have the same size.

The positions of the P⁺ base regions 22 of adjacent vertical MOSFETs 2 in an orthogonal direction D perpendicular to the arrangement direction C are offset from each other in the arrangement direction C as shown in FIGS. 1 and 17. In other words, the vertical MOSFETs 2 are arranged alternately with each other. Specifically, if the length of the vertical MOSFET 2 in the arrangement direction C is L, the offset distance is L/2. Thus, the gap between the vertical MOSFETs 2 is T-shaped.

Figure 3:
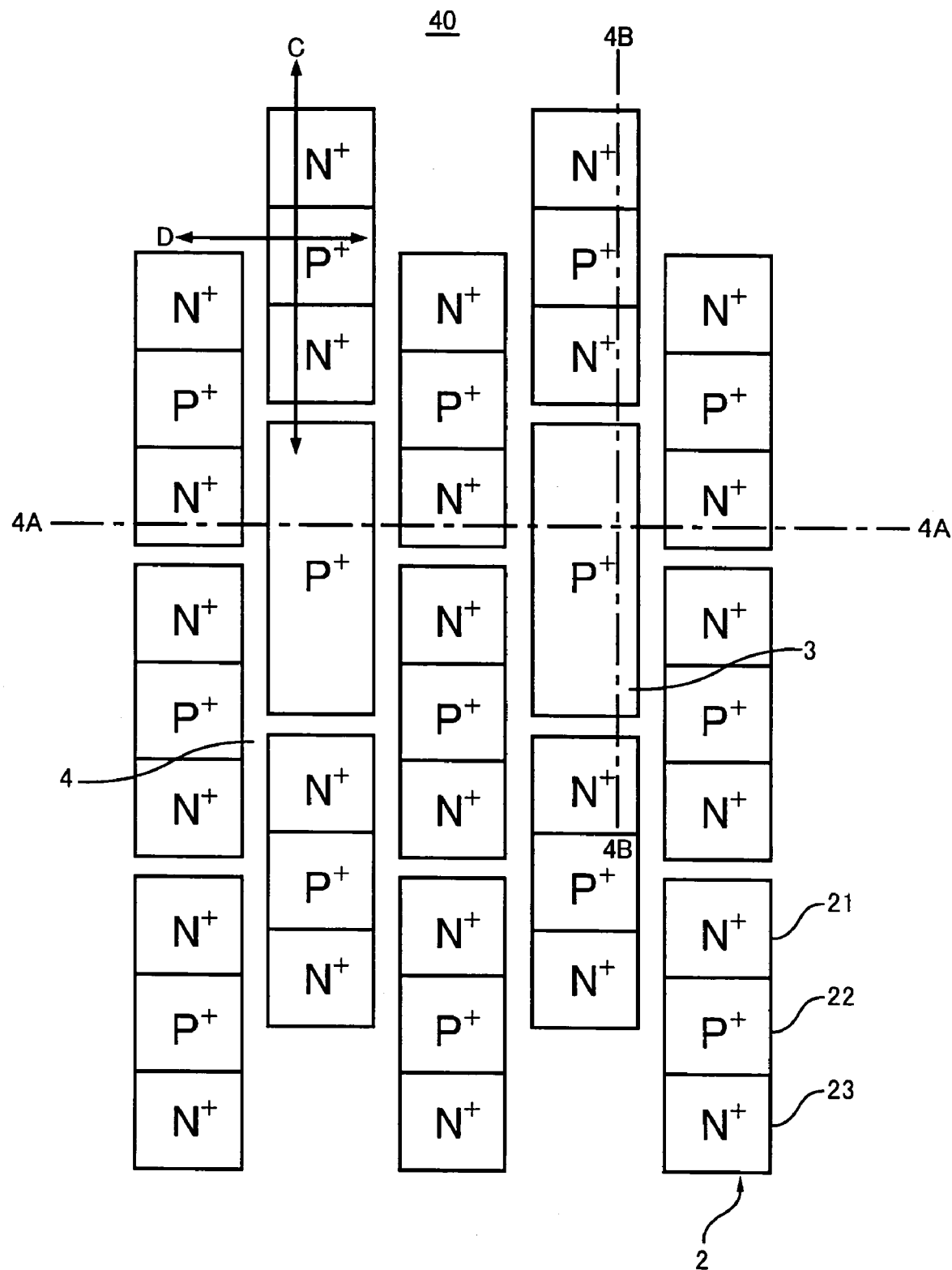
FIG. 3 is a view showing the planar layout of unit cells of a semiconductor device of another embodiment of the invention.
Figure 4A:
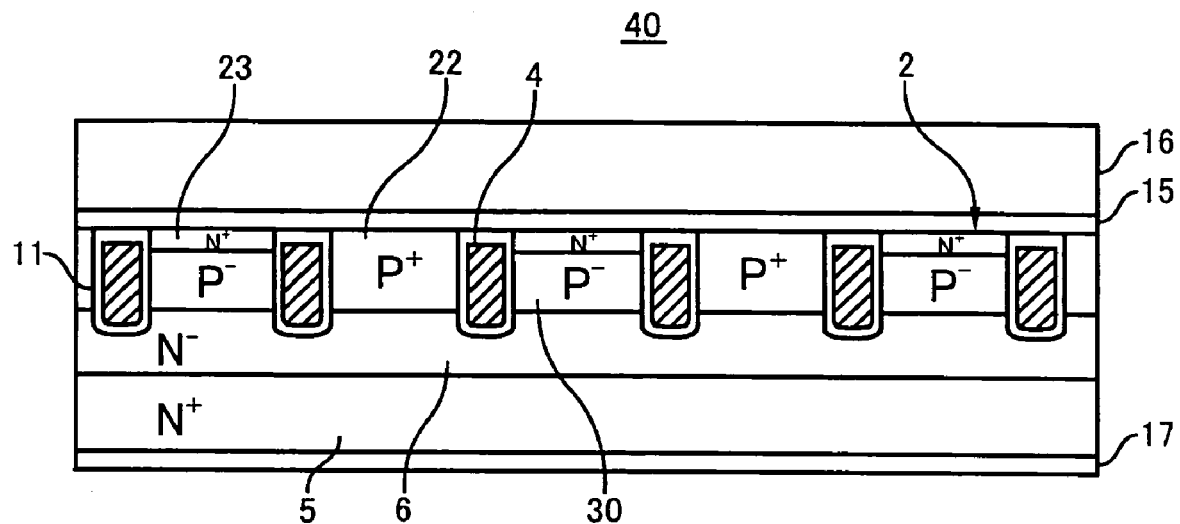
FIGS. 4A and 4B are cross sectional views of the semiconductor device of FIG. 3 along line A-A and line B-B, respectively.
Figure 4B:
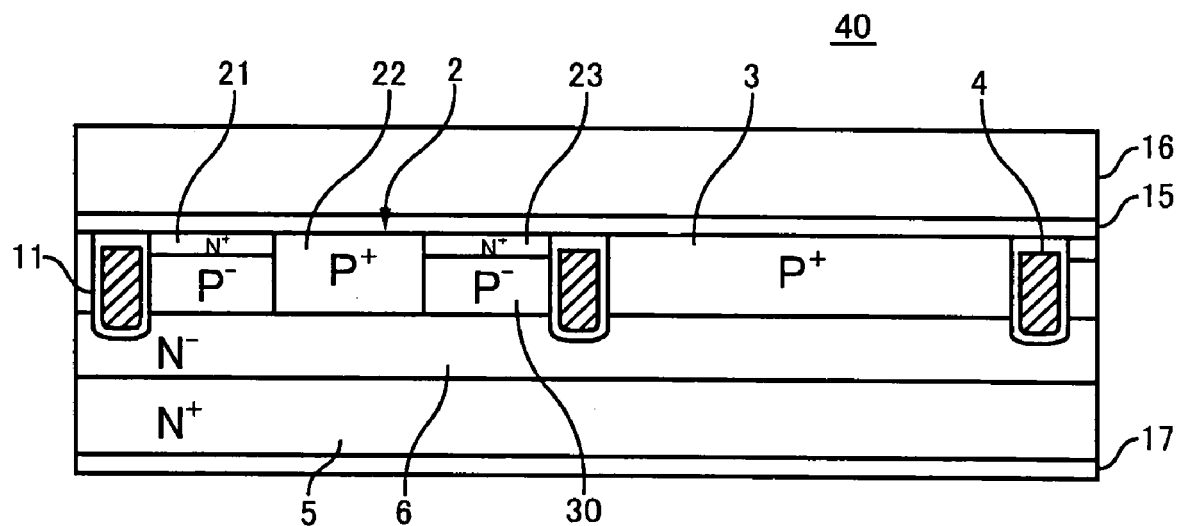

FIGS. 3 and 4 show a semiconductor device of another embodiment. FIG. 3 shows the planar layout of unit cells in the semiconductor device 40. FIGS. 4A and 4B show the cross sections along line 4A-4A and line 4B-4B of FIG. 3, respectively.

Besides the vertical MOSFETs 2, the semiconductor device 40 has P⁺ base regions (high impurity base regions) 3, each as a unit cell. The P⁺ base region has substantially the same size as the MOSFET 2. The semiconductor device 40 has the same configuration as the semiconductor device 1 except for the above. In the semiconductor device 40, some of the unit cells are not the vertical MOSFETs 2 but the P⁺ base regions 3.

A method of manufacturing the semiconductor device 1 and 40 is explained hereinafter with reference to FIGS. 5 to 14. For simplification, FIGS. 5 to 10 show the cross sections corresponding to only part of the lines 1A-1A and 3A-3A of FIGS. 1 and 3.

FIGS. 11 to 14 show the method of manufacturing the semiconductor device 40. Like FIG. 4, FIGS. 11 to 14 show the cross sections corresponding to the entire part of the lines 4A-4A and 4B-4B of FIG. 3.

Figure 5:
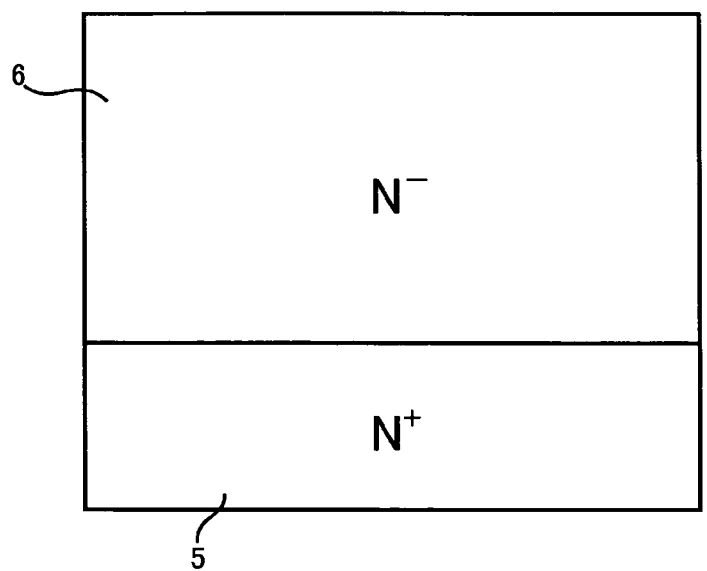
FIG. 5 is a cross sectional view to explain a method of manufacturing the semiconductor device of FIG. 1 and FIG. 3.

Referring first to FIG. 5, an N⁻ epitaxial layer 6 is grown on an N⁺ silicon substrate (semiconductor substrate) 5.

The N⁺ silicon substrate 5 preferably has a crystal face (100) and is doped with arsenic (As) of $1*10^{19}/cm^3$ to $8*10^{19}/cm^3$. The thickness of the N⁺ silicon substrate 5 is 600 to 700 μm for a wafer of 6 inches, for example.

The thickness and impurity concentration of the N⁻ epitaxial layer 6 are determined based on the withstand voltage and on-resistance of the MOSFET. In this example, the N⁻ epitaxial layer 6 has the thickness of about 5 μm and is doped with phosphorus (P) of about $2*10^{16}/cm^3$.

Figure 6:
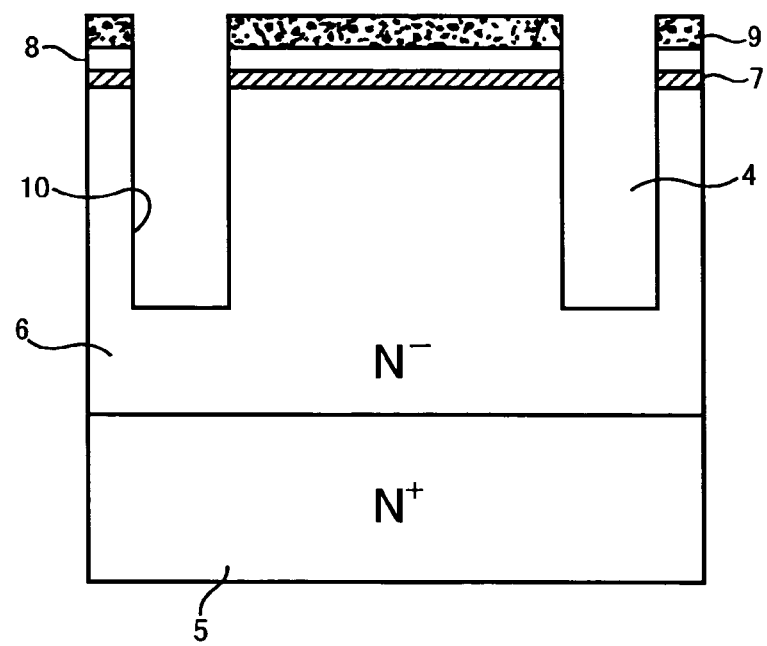
FIG. 6 is a cross sectional view to explain the method of manufacturing the semiconductor device of FIG. 1 and FIG. 3.
Figure 7:
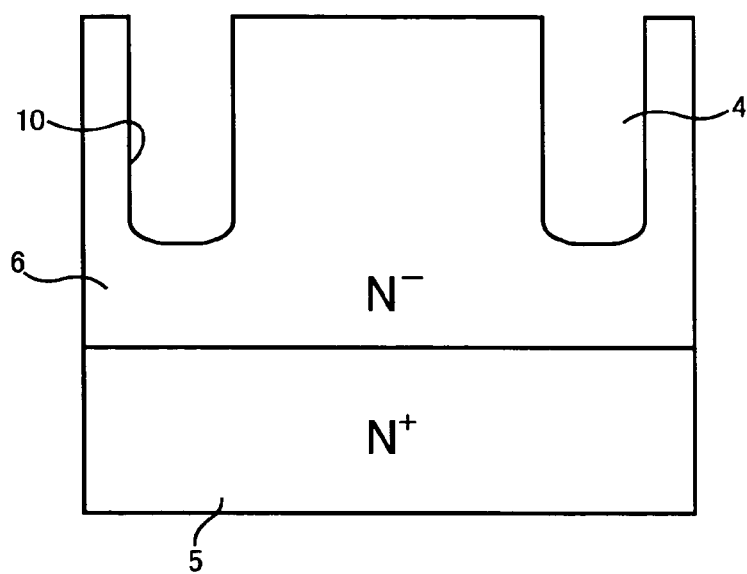
FIG. 7 is a cross sectional view to explain the method of manufacturing the semiconductor device of FIG. 1 and FIG. 3.

Referring next to FIG. 6, an oxide layer ($SiO_2$) 7 with the thickness of 10 to 50 nm is formed by thermal oxidation. Then, a nitride layer ($Si_3N_4$) 8 with the thickness of 100 to 200 nm and an oxide layer 9 with the thickness of 100 to 200 nm are successively deposited thereon by chemical vapor deposition (CVD). The composite layer of the oxide layer 7, nitride layer 8, and oxide layer 9 is patterned by photolithography.

Then, silicon etching is performed using the composite layer as a mask, thereby forming a trench 10 in the N⁻ epitaxial layer 6.

The depth and width of the trench 10 and the distance between the trenches should be appropriate values since they affect the withstand voltage and on-resistance of the vertical MOSFET 2. However, some degree of freedom is allowed, relating to formation of an impurity diffusion layer, which is deposited later. The width of the trench 10 can be 0.5 μm or less, for example, by microfabrication. The depth of the trench 10 is preferably smaller than the thickness of the N⁻ epitaxial layer 6 and greater than a P base layer, which is formed later. In this example, the thickness of the trench 10 is about 1 to 1.5 Referring then to FIG. 7, the composite layer is etched away, and the corners at the opening and bottom of the trench 10 are round. The method of rounding the corners includes the followings.

Japanese Unexamined Patent Publication No. 10-223891 introduces a method that grows a sacrificial oxide layer on a silicon surface in an oxygen atmosphere at about 1100° C. and then etches it away. "Proceedings of International Symposium On Power Semiconductor Devices and ICs (2000)" introduces another method that performs thermal treatment in a hydrogen atmosphere at about 950° C.

Figure 8:
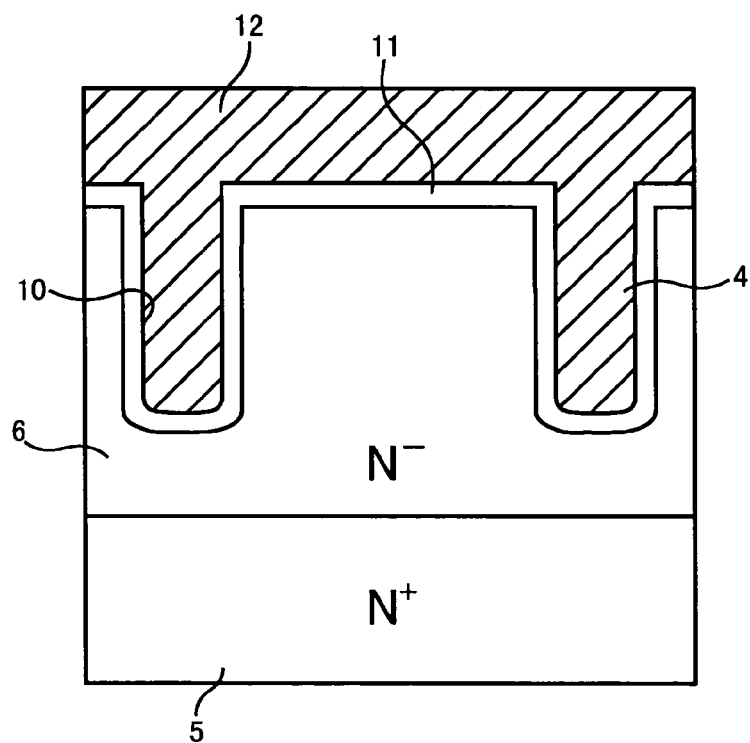
FIG. 8 is a cross sectional view to explain the method of manufacturing the semiconductor device of FIG. 1 and FIG. 3.

Then, referring to FIG. 8, a gate oxide layer 11 with the thickness of 10 to 100 nm is formed on the surface of the N⁻ epitaxial layer 6 and the inner surface of the trench 10 by thermal oxidation. Further, a polysilicon 12 is deposited thereon by CVD.

To ensure that the trench 10 is filled with the polysilicon 12, the thickness of the polysilicon 12 is greater than the opening width of the trench 10. For example, if the opening width of the trench 10 is 0.35 μm, the thickness of the polysilicon 12 is 0.35 to 0.7 μm since the opening width of the trench 10 can increase by the rounding process.

The polysilicon 12 is preferably low-resistance since it serves as the gate electrode 4. One way is to diffuse P or As into the deposited polysilicon 12 to make it high-concentration N type. Another way is to deposit the polysilicon 12 with the impurity doped thereinto.

Figure 9:
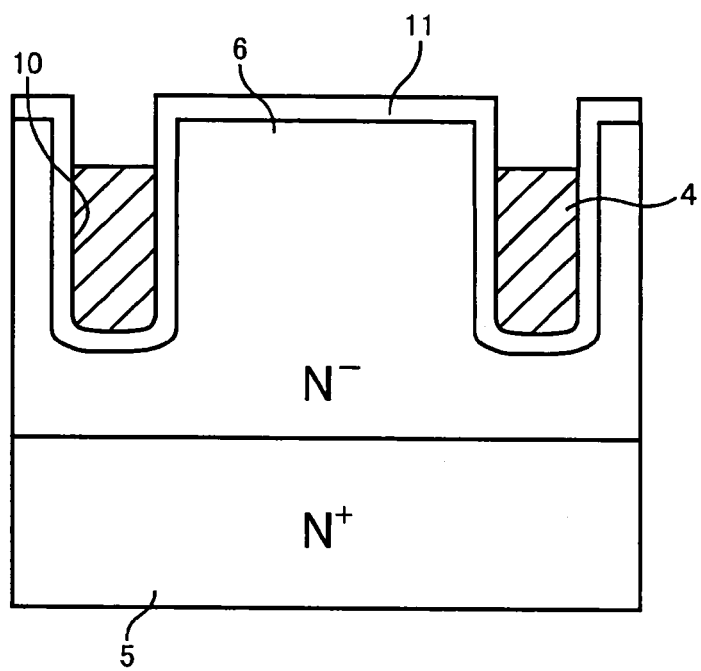
FIG. 9 is a cross sectional view to explain the method of manufacturing the semiconductor device of FIG. 1 and FIG. 3.

Referring then to FIG. 9, the polysilicon 12 is etched back so that the polysilicon 12 remains only inside the trench 10 to serve as the gate electrode 4. For example, the polysilicon 12 is etched until its upper end becomes lower than the surface of the N⁻ epitaxial layer 6 by 0.1 to 0.3 μm.

Figure 10:
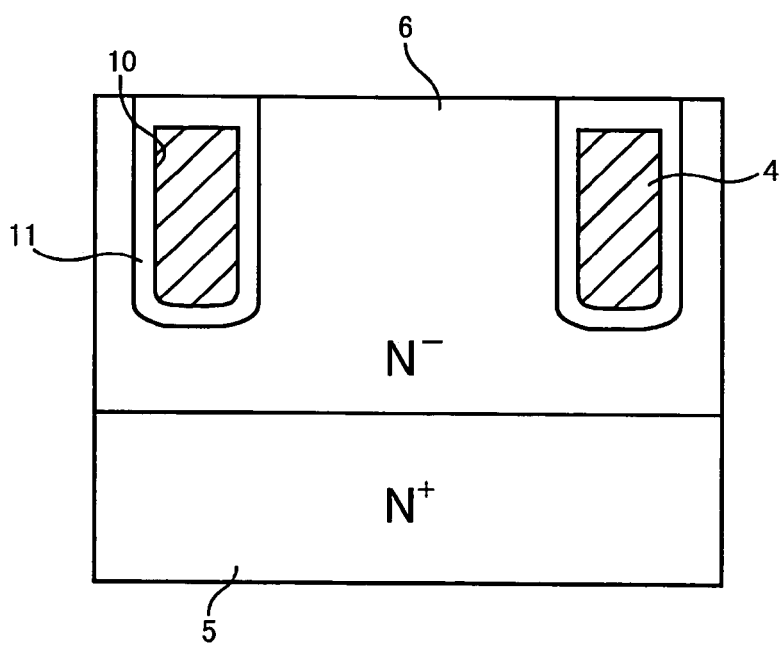
FIG. 10 is a cross sectional view to explain the method of manufacturing the semiconductor device of FIG. 1 and FIG. 3.

After that, an oxide layer is grown on the gate electrode 4 and the gate oxide layer 11 by CVD and then etched back until the surface of the N⁻ epitaxial layer 6 is exposed, as shown in FIG. 10. The upper surface of the gate electrode 4 is thereby covered with the oxide layer integral with the gate electrode 11.

Figure 11A:
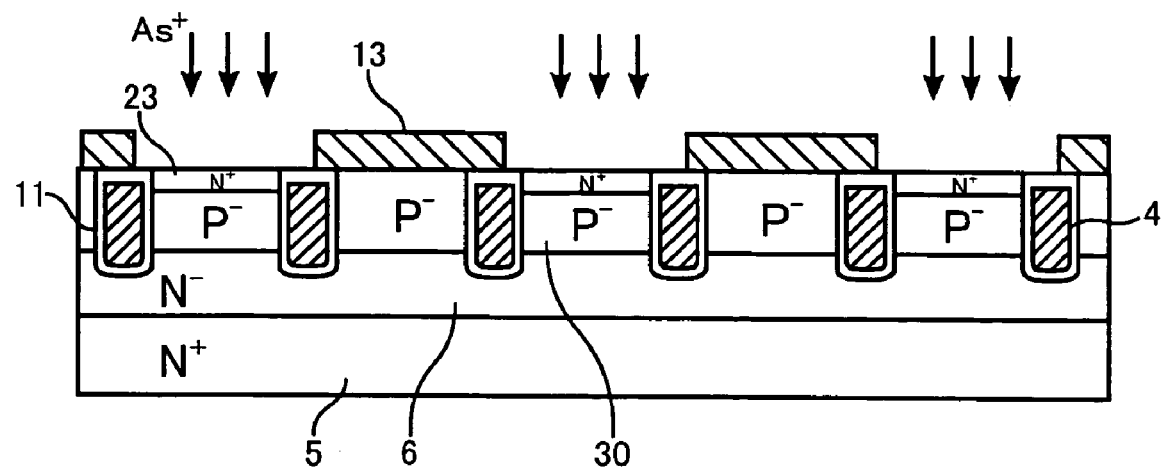
FIGS. 11A and 11B are cross sectional views to explain the method of manufacturing the semiconductor device of FIG. 3.
Figure 11B:
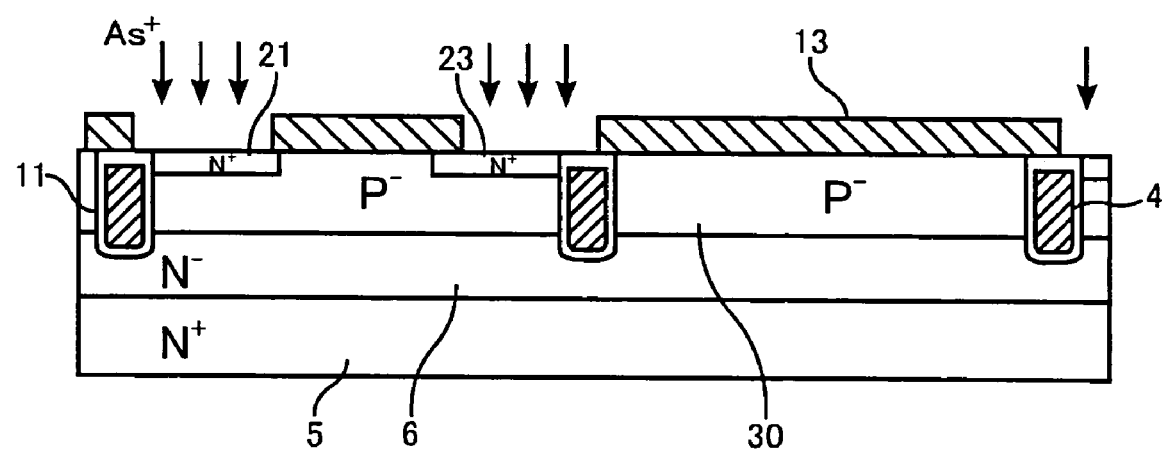

Referring now to FIGS. 11A and 11B, ion is implanted into the upper part of the N⁻ epitaxial layer 6. The implanted ion is boron (B) or boron fluoride (BF2), for example. After that, the upper part of the N⁻ epitaxial layer 6 is thermal-treated in an oxide or nitride atmosphere. The ion implantation and thermal treatment change the upper part of the N⁻ epitaxial layer 6 into the P⁻ base region (low-concentration base region) 30. The thickness of the P⁻ base region 30 is smaller than the trench 10, for example.

In this process, the implantation of B ion with the energy of 30 to 80 keV and the dose amount of $5*10^{12}/cm^2$ to $5*10^{13}/cm^2$ and the thermal treatment at 9500 to 1150° C. for several ten minutes allow formation of the P⁻ base region 30 with the thickness of about 0.5 to 1.5 μm. The temperature of the thermal treatment may be set according to the desired depth of the P⁻ base region 30.

Further, in the upper part of the P base region thus formed, As ion implantation and thermal treatment in an oxide or nitride atmosphere are performed successively. The ion implantation and thermal treatment change the upper part of the P⁻ base layer 30 into the N⁺ source region 21 or 23, as shown in FIGS. 11A and 11B. The ion implantation process uses a photoresist mask 13 with a given mask pattern to form the N⁺ source regions 21 and 23 in the layout shown in FIG. 3 or 1. In this ion implantation process, the areas to serve as the P⁺ base region 22 or the P⁺ diffusion region 3 are masked.

In this process, the implantation of As ion with the energy of 30 to 100 keV and the dose amount of $1*10^{15}/cm^2$ to $5*10^{16}/cm^2$ and the thermal treatment at 800° to 900° C. for several minutes to several ten minutes allow formation of the N⁺ source region 21, 23 with the thickness of about 0.1 to 0.5 μm.

Figure 12A:
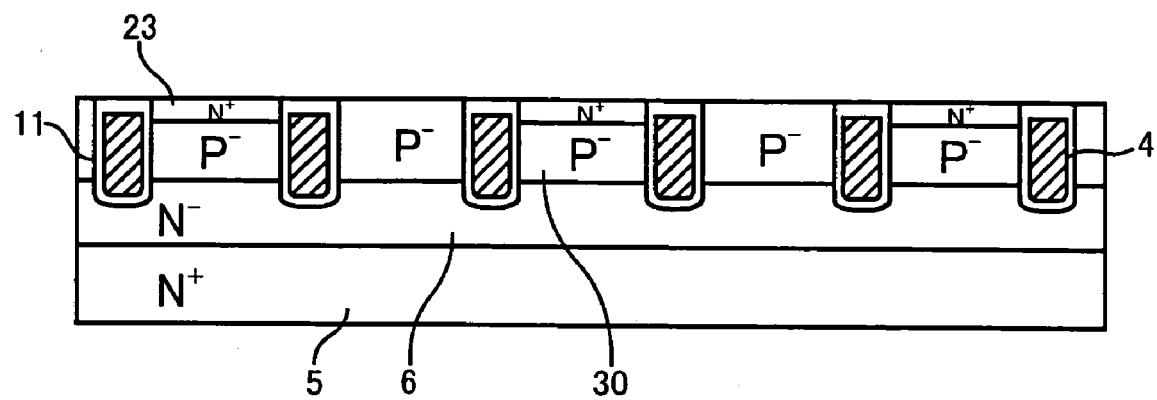
FIGS. 12A and 12B are cross sectional views to explain the method of manufacturing the semiconductor device of FIG. 3.
Figure 12B:
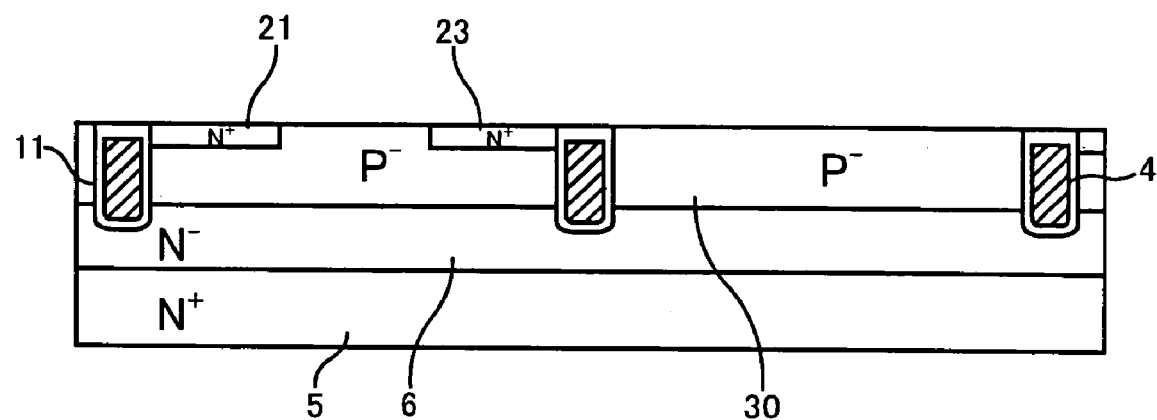

After that, the photoresist mask 13 is removed as shown in FIGS. 12A and 12B.

Figure 13A:
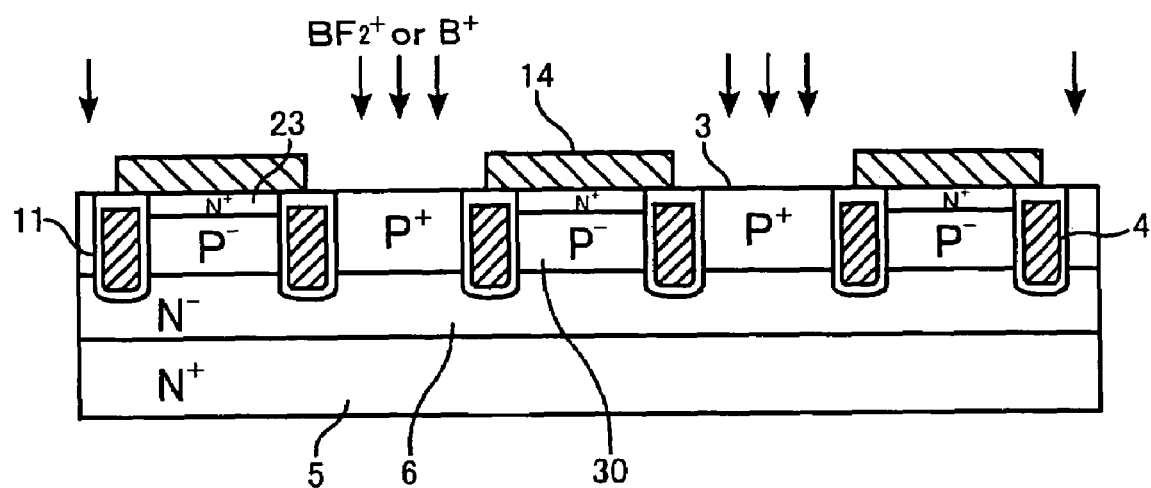
FIGS. 13A and 13B are cross sectional views to explain the method of manufacturing the semiconductor device of FIG. 3.
Figure 13B:
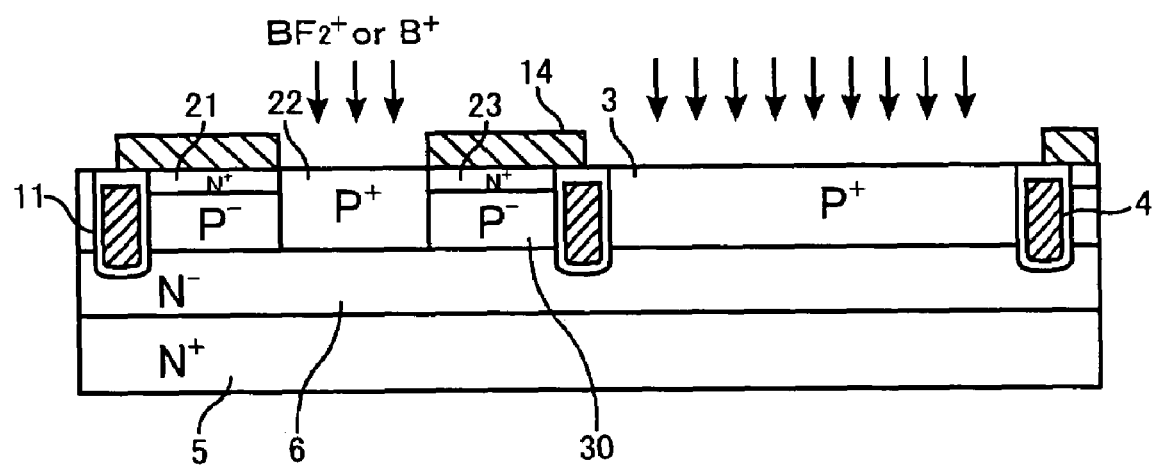

Referring then to FIGS. 13A and 13B, B or BF2 ion is implanted into the P base region different from the N⁺ source regions 21 and 23. After that, thermal-treatment is performed in an oxide or nitride atmosphere. The ion implantation and thermal treatment change the upper part of the P base region into the P⁺ base region 22 or the P⁺ region 3. The ion implantation process uses a photoresist mask 14 with a given mask pattern. The photoresist mask 14 is formed on the N⁺ source regions 21 and 23. This forms the P⁺ base regions 22 and the P⁺ regions 3 in the layout shown in FIG. 3 or the P⁺ base regions 22 in the layout shown in FIG. 1.

Figure 14A:
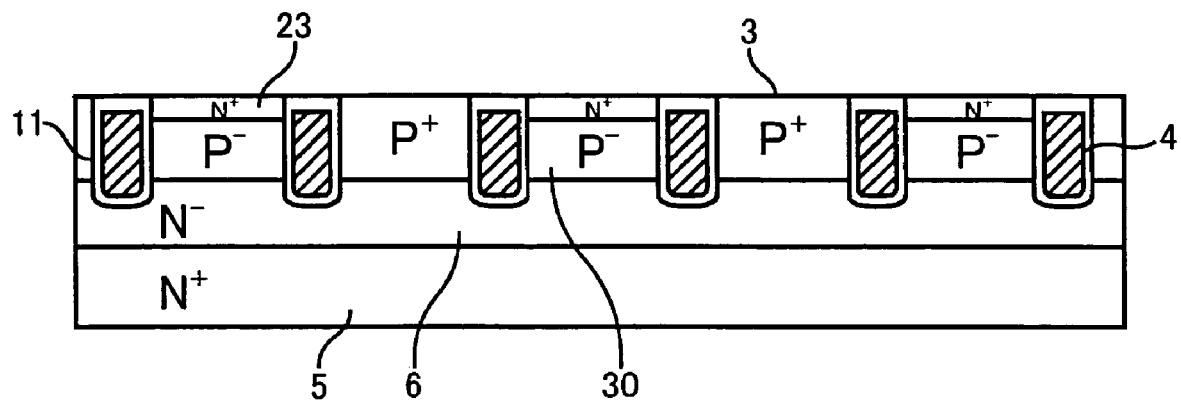
FIGS. 14A and 14B are cross sectional views to explain the method of manufacturing the semiconductor device of FIG. 3.
Figure 14B:
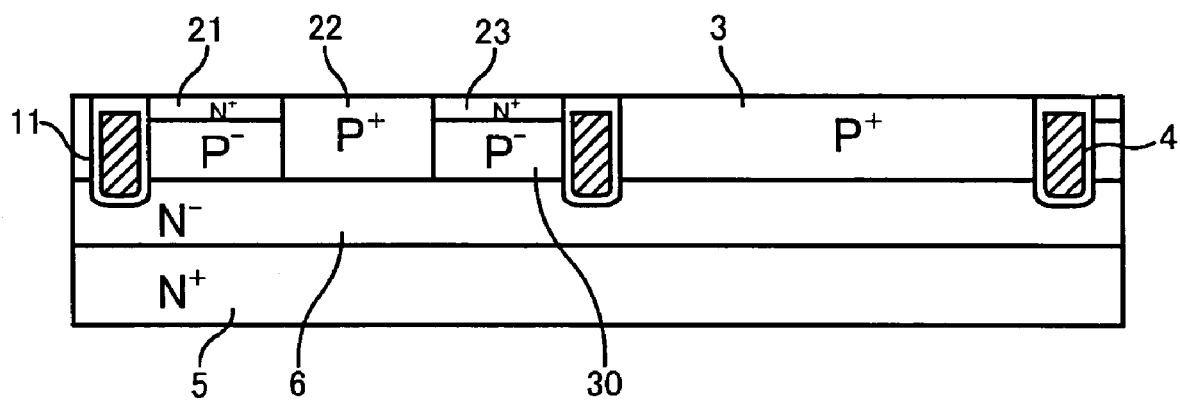

After that, the photoresist mask 14 is removed as shown in FIGS. 14A and 14B.

Finally, a barrier metal 15 made of titanium (Ti) or titanium nitride (TiN), for example, is deposited, and an aluminum layer 16 is formed thereon, as shown in FIGS. 2 and 4. Further, a drain electrode 17 is formed on the rear surface of the N⁺ silicon substrate 5.

The above processes produce the semiconductor device 1 and 40 as shown in FIGS. 2 and 4, respectively.

Figure 15A:
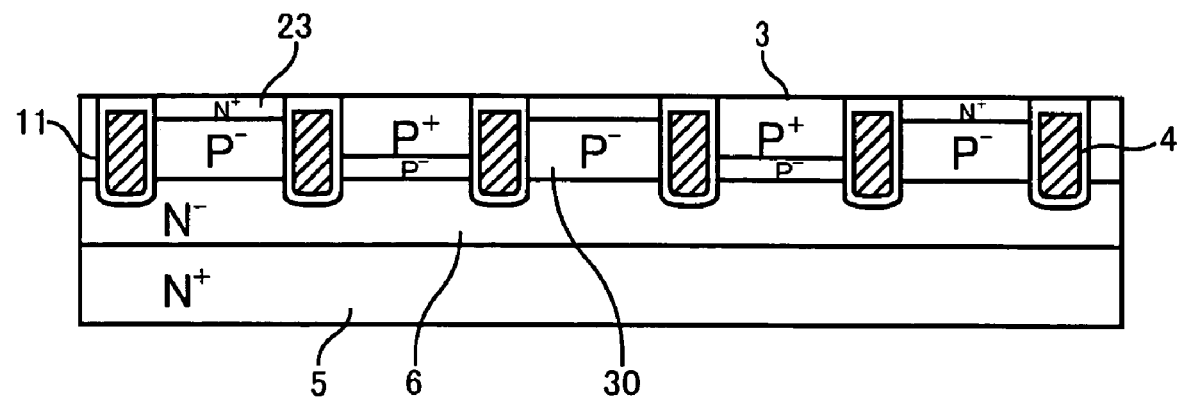
FIGS. 15A and 15B are cross sectional views showing a semiconductor device of a variant embodiment of the invention.
Figure 15B:
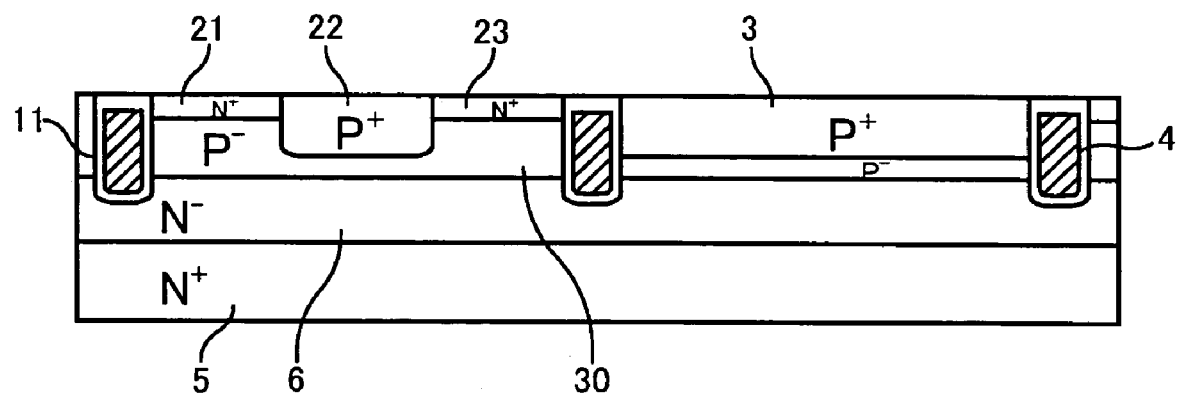

In the above manufacturing process, the thermal treatment process at the stage of FIG. 13 may reduce a treatment time. This results in decrease in the thickness of the P⁺ base regions 22 and 3 compared to the configuration shown in FIG. 14, as shown in FIG. 15. The P⁻ base region 30 thereby remains under the P⁺ base regions 22 and 3.

Figure 16A:
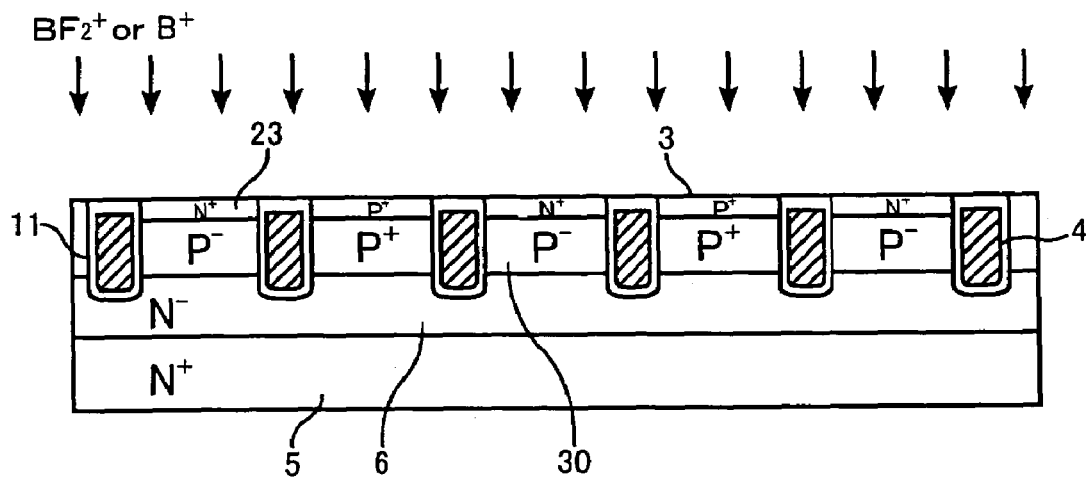
FIGS. 16A and 16B are cross sectional views to explain a method of manufacturing a semiconductor device of a variant embodiment of the invention.
Figure 16B:
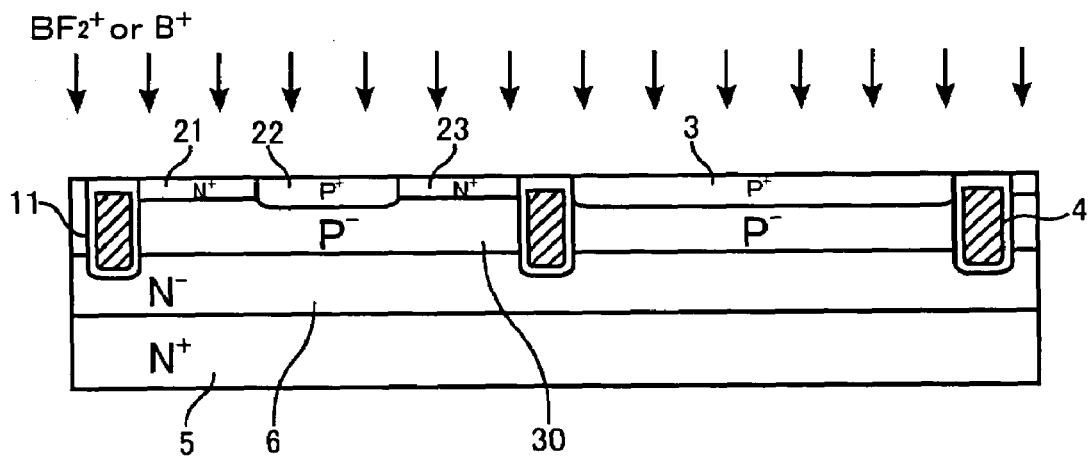

Alternatively, the ion implantation process at the stage of FIG. 13 may omit the formation of the photoresist mask 14 as shown in FIG. 16. In this case, in order to leave the P⁻ base region 30 under the N⁺ source regions 21 and 23, the ion should be implanted only into the surface part of the P base region. For this reason, it is preferred to form the P⁺ base regions 22 and 3 which are even thinner than those shown in FIG. 15.

As described in the foregoing, each unit cell of the semiconductor device is a vertical MOSFET 2 surrounded with the trench gate electrode 4 disposed between the unit cells. The vertical MOSFET 2 has the P⁻ base region 30 in the area surrounded with the gate electrode 4. The vertical MOSFET 2 further has the first N⁺ source region (first source region) 21, the P⁺ base region (high impurity base region) 22, and the second N⁺ source region (second source region) 23. The three regions are formed in the surface part of the P base region 30. The P⁺ base region 22 may reach the bottom of the P⁻ base region 30. When viewed from above, the three regions are arranged in such a way that the high concentration base region is placed between the first and second source regions.

Thus, the P⁻ base region 30 exists at least under the first and second N⁺ source regions 21 and 23. The first and second N⁺ source regions 21 and 23 of one vertical MOSFET 2 are separated from each other. The P⁺ base regions 22 of adjacent vertical MOSFETs 2 are also separated from each other. The N⁺ source regions (the first and second N⁺ source regions 21 and 23) of adjacent vertical MOSFETs 2 are also separated form each other.

A channel region 18 in the P base region 30 under the first and second N⁺ source regions 21 and 23 of the vertical MOS- FET 2 is thereby formed along the gate electrode 4, as shown in FIG. 17. This configuration allows higher channel density than the configuration shown in FIG. 21, increasing the current capacity to achieve a higher power MOSFET.

In the above embodiment, the first $N^+$ source region 21, $P^+$ base region 22, and second $N^+$ source region 23 are substantially rectangular-shaped. Thus, the channel region 18 is substantially U-shaped when viewed from above.

Figure 21:
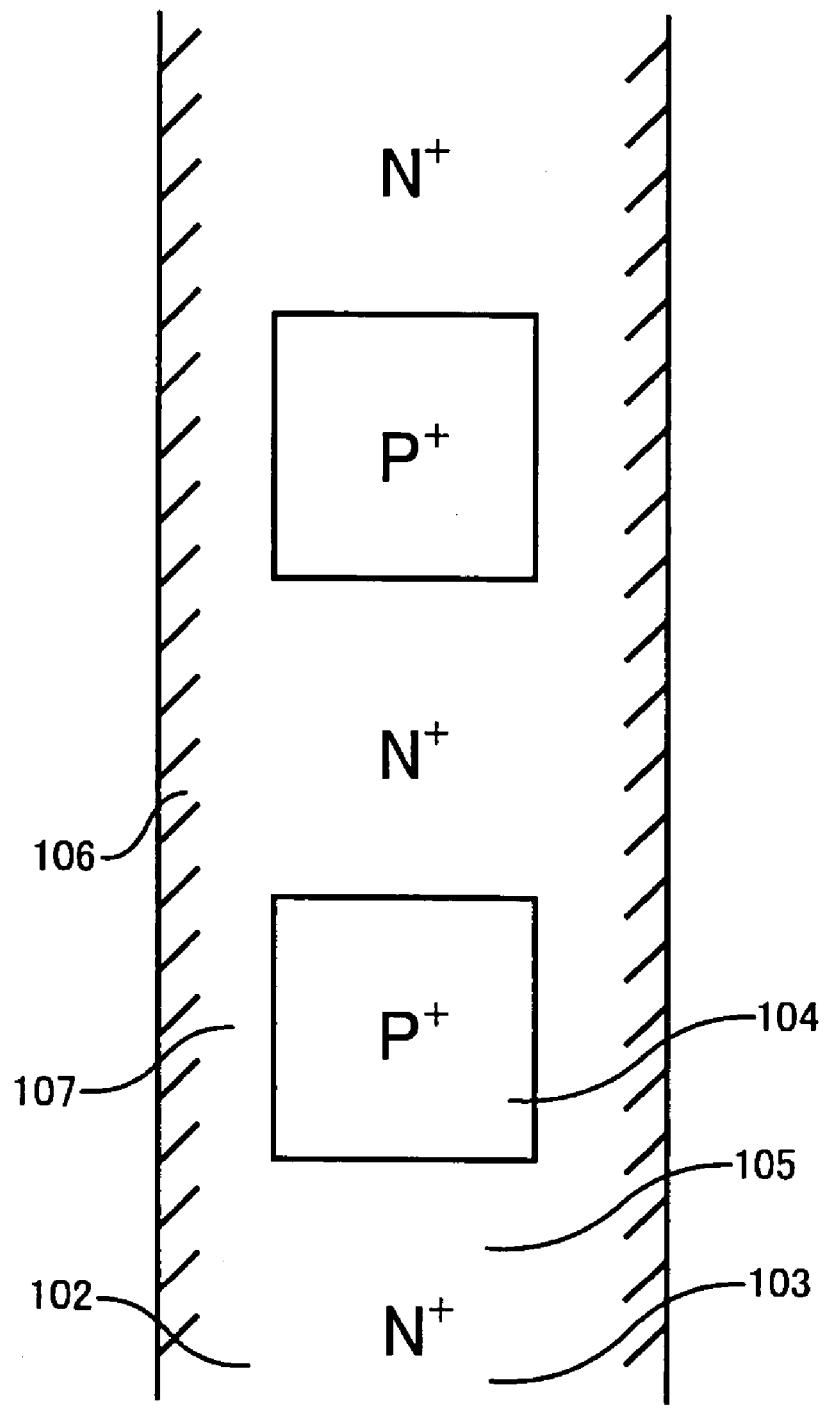
FIG. 21 is a view showing the planar layout of unit cells in the semiconductor device of FIG. 20.

This embodiment allows higher integration density than the configuration of FIG. 21, where the trench structure has a stripe-shape. Further, the first and second $N^+$ source regions 21 and 23 do not exist in the $P^+$ base region 22. This eliminates the need for forming the $N^+$ source region in both sides of the $P^+$ base region 22, which allows still higher integration density. The higher integration density allows increase in the channel density, thereby enhancing the current capacity.

This embodiment thereby achieves lower on-resistance.

As described earlier, the positions of the $P^+$ base regions 22 of adjacent vertical MOSFETs 2 in the orthogonal direction D perpendicular to the arrangement direction C are offset from each other in the arrangement direction C. In other words, the $P^+$ base regions 22 are not aligned. This avoids concentration of the avalanche current flowing through each of the $P^+$ base regions 22, thereby achieving high breakdown resistance.

Particularly, since the offset distance is one-half of the length L in the arrangement direction C of the vertical MOSFET 2, the positions of the $P^+$ base regions 22 are optimized, thereby achieving a highest breakdown resistance possible.

In the semiconductor device of this invention, it is possible to arrange the vertical MOSFETs 2 in such a way that the gap between the MOSFETs 2 is cross-shaped. However, in this case, it is difficult to completely fill the gap with the polysilicon 12 (gate electrode 4), causing a hole or recess to be formed at a center part 19 of the cross.

To avoid this, the semiconductor device 1 and 40 place the vertical MOSFETs 2 in such a way that the gap between the MOSFETs 2 is T-shaped. This allows the gap to be easily filled with the polysilicon 12. This prevents formation of a hole or recess in the gap area.

The above explanation shows the case where the first and second source regions are $N^+$ source regions 21 and 23, the high concentration base region is the $P^+$ base regions 22 and 3, and the low-concentration base region is the $P^-$ base region 30. This invention, however, is not limited thereto, and the conductivity type of each region may be opposite. The first and second source regions may be P+ source regions, the high concentration base region may be an $N^+$ base region, and the low-concentration base region may be an $N^-$ base region. In this case, the semiconductor substrate is P+ type and the epitaxial layer is $P^-$ type.

Figure 19:
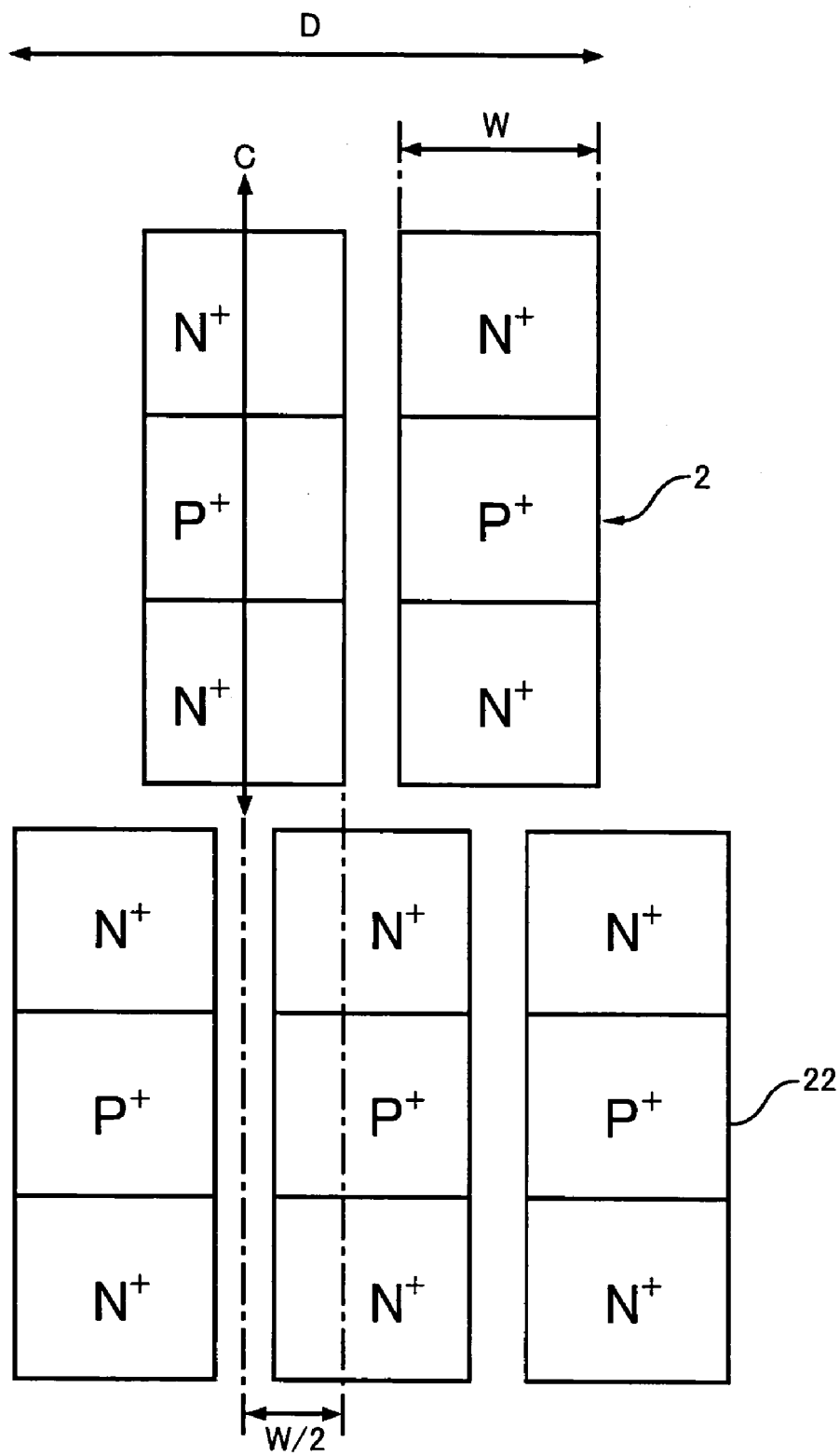
FIG. 19 is a view showing another example of the planar layout of unit cells.
Figure 20:
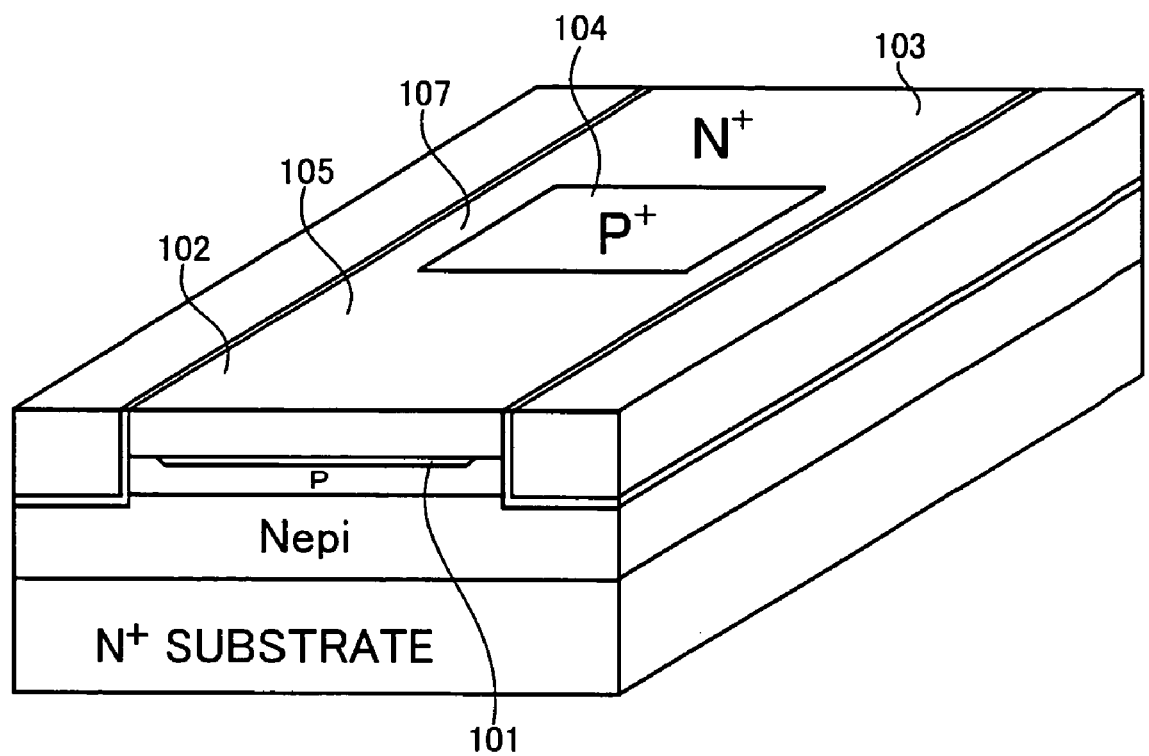
FIG. 20 is a perspective view of a semiconductor device of a related art.

The above explanation shows the case where the positions of the $P^+$ base regions 22 of adjacent vertical MOSFETs 2 in the orthogonal direction D perpendicular to the arrangement direction C are offset from each other in the arrangement direction C. This invention, however, is not limited thereto. The concentration of the avalanche current can be avoided if the positions of the $P^+$ base regions 22 of adjacent vertical MOSFETs 2 are offset from each other either in the arrangement direction C or in the orthogonal direction D. Thus, for example, the positions of the $P^+$ base regions 22 of adjacent vertical MOSFETs 2 may be offset from each other in the orthogonal direction D perpendicular to the arrangement direction C, as shown in FIG. 19. In this configuration, the offset distance is preferably W/2 where W is the width in the orthogonal direction D of the vertical MOSFET 2. Further, in the configuration of FIG. 19, the $P^+$ base regions 22 of the vertical MOSFET 2 may be formed at a time by using a photoresist with a slit pattern. The $P^+$ base regions 22 are formed by using a photoresist pattern of a hole shape in the configurations of FIGS. 1, 3, and 17.

It is apparent that the present invention is not limited to the above embodiment, that may be modified and changed without departing from the scope and spirit of the invention.

What is claimed is:

1. A semiconductor device comprising:
   a plurality of unit cells, each comprising a vertical metal oxide semiconductor field effect transistor (MOSFET), including:
   a first source region formed in a first base region,
   a second source region formed in the first base region and separated from the first source region, and
   a second base region formed in the first base region and disposed between the first and second source regions, said second base region having a higher impurity concentration than said first base region; and
   a trench gate surrounding on all sides each of the plurality of unit cells, so that each of the first and second source regions and the second base region are in direct contact with the trench gate.

2. The semiconductor device according to claim 1, wherein the first source region, the second source region, and the second base region are each rectangular-shaped.

3. A semiconductor device comprising:
   a plurality of unit cells, each comprising a vertical metal oxide semiconductor field effect transistor (MOSFET), including:
   a first source region formed in a first base region,
   a second source region formed in the first base region and separate and distinct from the first source region, and
   a second base region formed in the first base region and disposed between the first and second source regions, said second base region having a higher impurity concentration than said first base region; and
   a trench gate surrounding on all sides each of the plurality of unit cells,
   wherein a channel region in the first base region under the first and second source regions is formed along a side surface of each unit cell except for a part adjacent to the second base region.

4. The semiconductor device according to claim 3, wherein the first source region, the second source region, and the second base region are each rectangular-shaped, and the channel region in each unit cell is substantially U-shaped.

5. The semiconductor device according to claim 1, wherein the first source region, the second source region, and the second base region of the unit cells are arranged in a same first direction.

6. The semiconductor device according to claim 3, wherein the first source region, the second source region, and the second base region of the unit cells are arranged in a same first direction.

7. The semiconductor device according to claim 5, wherein positions of the second base regions of adjacent unit cells are offset from each other in the first direction or a second direction perpendicular to the first direction.

8. The semiconductor device according to claim 6, wherein positions of the second base regions of adjacent unit cells are offset from each other in the first direction or a second direction perpendicular to the first direction.

9. The semiconductor device according to claim 7, wherein an offset distance is one-half of a length of one unit cell in the first direction.

10. The semiconductor device according to claim 8, wherein an offset distance is one-half of a length of one unit cell in the first direction.

11. The semiconductor device according to claim 1, wherein the unit cells are arranged in such a way that a gap between the unit cells is T-shaped.

12. The semiconductor device according to claim 3, wherein the unit cells are disposed in such a way that a gap between the unit cells is T-shaped.

13. A semiconductor device comprising:
a plurality of unit cells, each comprising a vertical metal oxide semiconductor field effect transistor (MOSFET), including:
a first source region formed vertically above a first base region,
a second source region formed vertically above the first base region and separated from the first source region, and
a second base region formed in the first base region and disposed between the first and second source regions, said second base region having an impurity concentration higher than said first base region, bottom surfaces of said first and second base regions are coplanar; and
a trench gate formed between adjacent ones of the plurality of unit cells,
wherein one of the first and second source regions of a unit cell extends over an entirety of said first base region between said second base region and said trench gate.

14. The semiconductor device according to claim 1, wherein some unit cells of the plurality of unit cells further comprise an impurity diffusion region having substantially the same size as the plurality of unit cells that comprise the vertical MOSFET.

* * * * *